United States Patent
Wang et al.

(10) Patent No.: US 9,024,395 B2
(45) Date of Patent: May 5, 2015

(54) TAXEL-ADDRESSABLE MATRIX OF VERTICAL NANOWIRE PIEZOTRONIC TRANSISTORS

(71) Applicant: Georgia Tech Research Corporation, Atlanta, GA (US)

(72) Inventors: Zhong Lin Wang, Atlanta, GA (US); Wenzhuo Wu, Atlanta, GA (US); Xiaonan Wen, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 14/019,691

(22) Filed: Sep. 6, 2013

(65) Prior Publication Data

US 2014/0070338 A1  Mar. 13, 2014

Related U.S. Application Data

(60) Provisional application No. 61/698,156, filed on Sep. 7, 2012.

(51) Int. Cl.
*H01L 29/84* (2006.01)
*H01L 41/113* (2006.01)
*G06F 3/041* (2006.01)
(Continued)

(52) U.S. Cl.
CPC ............ *H01L 29/84* (2013.01); *H01L 41/1132* (2013.01); *G06F 3/0414* (2013.01); *G06F 2203/04103* (2013.01); *H01L 27/20* (2013.01); *H01L 41/22* (2013.01)

(58) Field of Classification Search
CPC ..... H01L 29/84; H01L 27/20; H01L 41/1132; H01L 41/25; G06F 3/0414
USPC ............................................ 257/415; 438/50
See application file for complete search history.

(56) References Cited

U.S. PATENT DOCUMENTS 6,586,095 B2  7/2003  Wang et al.
7,220,310 B2  5/2007  Wang et al.
(Continued)

OTHER PUBLICATIONS

Jeon et al., "MEMS power generator with transverse mode thin film PCT," Science Direct, vol. 122, Issue 1, Jul. 29, 2005, pp. 16-22.
(Continued)

*Primary Examiner* — Tu-Tu Ho
(74) *Attorney, Agent, or Firm* — Bryan W. Bockhop; Bockhop & Associates, LLC

(57) ABSTRACT

A tactile sensing matrix includes a substrate, a first plurality of elongated electrode structures, a plurality of vertically aligned piezoelectric members, an insulating layer infused into the piezoelectric members and a second plurality of elongated electrode structures. The first plurality of elongated electrode structures is disposed on the substrate along a first orientation. The vertically aligned piezoelectric members is disposed on the first plurality of elongated electrode structures and form a matrix having columns of piezoelectric members disposed along the first orientation and rows of piezoelectric members disposed along a second orientation that is transverse to the first orientation. The second plurality of elongated electrode structures is disposed on the insulating layer along the second orientation. The elongated electrode structures form a Schottky contact with the piezoelectric members. When pressure is applied to the piezoelectric members, current flow therethrough is modulated.

18 Claims, 1 Drawing Sheet

(51) Int. Cl.
*H01L 27/20* (2006.01)
*H01L 41/22* (2013.01)

(56) References Cited

U.S. PATENT DOCUMENTS

| | | | |
|---|---|---|---|
| 7,351,607 B2 | 4/2008 | Wang et al. | |
| 7,705,523 B2 | 4/2010 | Wang et al. | |
| 7,898,156 B2 | 3/2011 | Wang et al. | |
| 8,039,834 B2 | 10/2011 | Wang et al. | |
| 2003/0205657 A1 | 11/2003 | Voisin | |
| 2004/0127025 A1 | 7/2004 | Crocker, Jr. et al. | |
| 2005/0188751 A1 | 9/2005 | Puskas | |
| 2005/0242366 A1 | 11/2005 | Parikh et al. | |
| 2007/0170438 A1* | 7/2007 | Partridge et al. | 257/77 |
| 2007/0234793 A1* | 10/2007 | Liu et al. | 73/198 |
| 2008/0067618 A1 | 3/2008 | Wang et al. | |
| 2008/0121045 A1* | 5/2008 | Cole et al. | 73/861.08 |
| 2009/0066195 A1 | 3/2009 | Wang et al. | |
| 2009/0115293 A1 | 5/2009 | Wang et al. | |
| 2009/0179523 A1 | 7/2009 | Wang et al. | |
| 2009/0209303 A1 | 8/2009 | Kroll et al. | |
| 2010/0026142 A1 | 2/2010 | Jones et al. | |
| 2010/0117488 A1 | 5/2010 | Wang et al. | |
| 2010/0139750 A1 | 6/2010 | Kim et al. | |
| 2010/0141095 A1 | 6/2010 | Park | |
| 2010/0147371 A1 | 6/2010 | Cho | |
| 2010/0171095 A1 | 7/2010 | Wang et al. | |
| 2010/0191153 A1 | 7/2010 | Sanders et al. | |
| 2010/0253184 A1 | 10/2010 | Choi et al. | |
| 2010/0258160 A1 | 10/2010 | Wang et al. | |
| 2010/0314968 A1 | 12/2010 | Mohamadi | |
| 2011/0050042 A1 | 3/2011 | Choi et al. | |
| 2011/0107569 A1 | 5/2011 | Wang et al. | |
| 2011/0310459 A1* | 12/2011 | Gates et al. | 359/296 |
| 2013/0106244 A1* | 5/2013 | Liu et al. | 310/338 |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

* cited by examiner

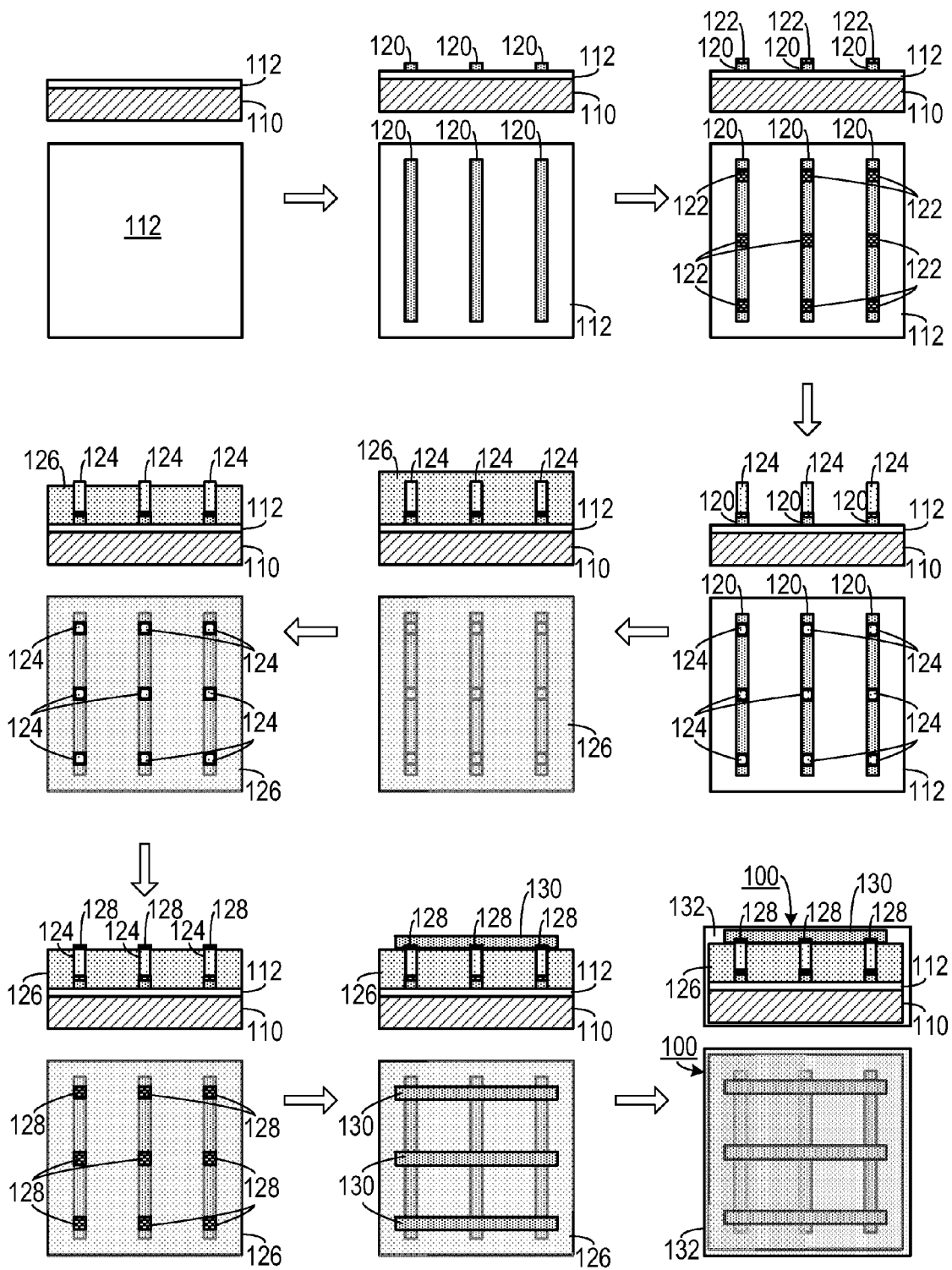

TAXEL-ADDRESSABLE MATRIX OF VERTICAL NANOWIRE PIEZOTRONIC TRANSISTORS

CROSS-REFERENCE TO RELATED APPLICATION(S)

This application claims the benefit of U.S. Provisional Patent Application Ser. No. 61/698,156, filed Sep. 7, 2012, the entirety of which is hereby incorporated herein by reference.

STATEMENT OF GOVERNMENT INTEREST

This invention was made with government support under agreement No. DE-FG02-07ER 46394, awarded by the Department of Energy and under agreement No. CMMI-0946418, awarded by the National Science Foundation. The government has certain rights in the invention.

BACKGROUND OF THE INVENTION

1. Field of the Invention

The present invention relates to sensing devices and, more specifically, to a tactile sensing device.

2. Description of the Related Art

Large-scale integration of miniscule functional components on mechanically deformable and optically transparent substrates may lead to novel applications in mechanosensational human-electronics interfacing, sensing and energy harvesting. Taxel (tactile pixel) array based pressure sensors have been used for mimicking tactile sensing capabilities of human skin, in which electronic components like traditional field-effect-transistors (FETs) act as read-out elements for detecting pressure-induced property change in the pressure-sensitive media.

Some systems attempt to minimize the effect of substrate strain on performance of these electronic components while preserving the deformability of the substrate employing flexible electronics. Existing flexible electronic pressure sensing systems require complicated system integration of heterogeneous components but also lack proficiency in directly interfacing electronics with mechanical actions in an active way so that mechanical straining can be utilized to generate new electronic control/feedback. Also, existing taxel sizes can be hundreds of microns to even tens of millimeters, severely limiting device density and spatial resolution.

Therefore, there is a need for a high resolution taxel array pressure sensor that interfaces well with electronic components.

SUMMARY OF THE INVENTION

The disadvantages of the prior art are overcome by the present invention which, in one aspect, is a method of making a tactile sensing matrix in which a substrate is generated. A first plurality of elongated electrodes is deposited, spaced apart, on the substrate along a first orientation. A first plurality of conductive shapes is deposited onto each of the first plurality of elongated electrodes, spaced apart so that the conductive shapes form a matrix including columns aligned with the first orientation and rows that are transverse to the first orientation. A vertically aligned piezoelectric member is generated at each of the first plurality of conductive shapes to form a plurality of piezoelectric members. The piezoelectric members include a material that forms a Schottky contact with the first plurality of conductive shapes. A second plurality of conductive shapes is deposited each on a different piezoelectric member. The second plurality of conductive shapes includes a material that forms a Schottky contact with the piezoelectric member. An insulating layer is infused into the piezoelectric members. A second plurality of elongated electrodes is deposited each along a different row of the matrix so that each of the second plurality of elongated electrodes is in electrical communication with all of the second plurality of conductive shapes of a different row of piezoelectric members. When pressure is applied to selected ones of the plurality of vertically-aligned piezoelectric members, current flow through the selected ones of the plurality of vertically-aligned piezoelectric members is modulated.

In another aspect, the invention is a tactile sensing matrix that includes a substrate, a first plurality of elongated electrode structures, a plurality of vertically aligned piezoelectric members, an insulating layer and a second plurality of elongated electrode structures. The first plurality of elongated electrode structures is spaced apart and disposed on the substrate along a first orientation. The plurality of vertically aligned piezoelectric members is disposed on each of the first plurality of elongated electrode structures. The piezoelectric members are spaced apart so as to form a matrix both along the first plurality elongated electrode structures and across the first plurality elongated electrode structures. The matrix has columns of piezoelectric members disposed along the first orientation and rows of piezoelectric members disposed along a second orientation that is transverse to the first orientation. The insulating layer is infused into the piezoelectric members. The second plurality of elongated electrode structures is spaced apart and disposed on the insulating layer along the second orientation. The first plurality of elongated electrode structures include a material selected so that each of the first plurality of elongated electrode structures forms a Schottky contact with each piezoelectric member in a different column of piezoelectric members. The second plurality of elongated electrode structures includes a material selected so that each of the second plurality of elongated electrode structures forms a Schottky contact with each piezoelectric member in a different row of piezoelectric members. When pressure is applied to selected ones of the plurality of vertically-aligned piezoelectric members, current flow through the selected ones of the plurality of vertically-aligned piezoelectric members is modulated.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 1 is a series of schematic views showing several steps employed in making a tactile sensing matrix.

DETAILED DESCRIPTION OF THE INVENTION

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

The following patents, issued to Wang et al., disclose methods of making piezoelectric nanostructures and are incorporated herein by reference for the purpose of disclosing piezoelectric nanostructure growth methods: U.S. Pat. No. 7,351,607, issued on Apr. 1, 2008; U.S. Pat. No. 7,982,370, issued on Jul. 19, 2011; U.S. Pat. No. 7,898,156, issued on Mar. 1, 2011; and U.S. Pat. No. 8,039,834 issued on Oct. 18, 2011. The following patent applications, filed by Wang et al., disclose methods of making piezoelectric nanostructures and are incorporated herein by reference for the purpose of disclosing piezoelectric nanostructure growth methods: Ser. No. 13/091,855, filed on Apr. 21, 2011 and Ser. No. 13/473,867 filed May 17, 2012.

As shown in FIG. 1, one embodiment of a tactile sensing matrix 100 includes a substrate portion 110 onto which is deposited a thin $SiO_2$ layer 112. Disposed on the $SiO_2$ layer 112 is a plurality of electrodes 120 laid out in columns. In one embodiment, the electrodes 120 include thin Cr strips applied to the $SiO_2$ layer 112 and ITO strips applied to the Cr strips, which improve adhesion of the ITO to the $SiO_2$ layer 112. (Since ITO is transparent, use of ITO electrodes allows for a transparent device.) A plurality of spaced apart conductive shapes 122 (such as Au squares) is applied to the electrodes 120 to form a matrix with rows and columns. (If a non-transparent device is desired, the electrodes can comprise a conductor such as Au instead of ITO and separate conductive shapes are not necessary.)

Vertically aligned semiconductor piezoelectric members 124 are applied to the conductive shapes 122. In one example, the piezoelectric members 124 include dense bundles of ZnO nanowires. (Other embodiments can include ZnO, ZnS, GaN, GaAs and other piezoelectric semiconductors in the form of dense bundles of nanowires, discrete nanowires and even thin films.) The conductive shapes 122 form a Schottky contact with the piezoelectric members 124.

An insulating layer 126, such as SU 8, is infused into the piezoelectric members 124 to provide support thereto. The top of the insulating layer 126 is etched away to expose the tops of the piezoelectric members 124 and a second plurality of conductive shapes 128 (such as Au squares) is applied to the tops of the piezoelectric members 124 also forming Schottky contacts with the piezoelectric members 124. A second plurality of electrodes 130 is placed on the conductive shapes 128 along different rows of the matrix. A protective cover 132, such as parylene, can then be applied to the entire device.

When vertical force is applied to individual piezoelectric members 124, current flowing through the taxel corresponding piezoelectric members 124 is modulated. By scanning individual rows of top electrodes 130 for each column of bottom electrodes 120, the state of individual taxels may be sensed.

In one experimental embodiment, the following steps were employed to make a tactile sensing matrix:

Substrate Preparation
1. Clean the Polyethylene terephthalate (PET) substrate or silicon wafer (acetone, isopropyl alcohol (IPA), deionized (DI) water).
2. Deposit a thin layer of $SiO_2$ (30 nm) to the substrate via electron-beam evaporation.

Bottom Electrode Formation
3. Spin-coat negative-tone photoresist (Futurrex NR9-1500PY) onto the substrates and soft-bake at 150° C. for 60 s.
4. Expose the samples with 365 nm UV lithography using first layer pattern.
5. Post-bake the samples at 100° C. for 60 s.
6. Develop the exposed samples in aqueous base developer (Futurrex Resist Developer RD6).
7. Rinse and blow-dry the samples.
8. Deposit 150 nm ITO as the bottom electrodes through RF magnetron sputtering.
9. Immediately deposit 3 nm Cr onto the ITO electrodes through electron beam evaporation.
10. Lift-off ITO/Cr in acetone.

Bottom Schottky Contact Formation and Active Area Defining
11. Clean the processed samples in step 10 (acetone, IPA, DI water).
12. Pattern photoresist using second layer mask (steps 3-7).
13. Deposit 20 nm Au through electron beam evaporation.
14. Deposit 100 nm ZnO through RF magnetron sputtering.
15. Lift-off Au/ZnO in acetone.

Synthesis of Vertical ZnO Nanowires Array
16. Clean the processed samples in step 15 (acetone, IPA, DI water).
17. Immerse the samples into the growth solution (25 mM $ZnCl_2$ and 25 mM Hexamethylenetetramine (HMTA, $(CH_2)_6N_4$)) at 85° C. for 6 hrs.

Encapsulation of Vertical ZnO Nanowires Array
18. Clean the processed samples in step 17 (acetone, IPA, DI water).
19. Spin-coat encapsulation polymer (Microchem SU 8 2025) onto the samples.
20. Expose the samples with 365 nm UV lithography.
21. Cure the samples at 150° C. for 1 hr.

Exposure of Top Surfaces of ZnO Nanowires
22. Clean the processed samples in step 21 (acetone, IPA, DI water).
23. Dry etch the SU 8 layer in a reactive ion etcher.
24. Oxygen plasma treatment (50 W, 180 mTorr, 15 minutes)

Top Schottky Contact Formation
25. Clean the processed samples in step 23 (acetone, IPA, DI water).
26. Pattern photoresist using second layer mask (steps 3-7).
27. Deposit 80 nm Au through electron beam evaporation.
28. Lift-off Au in acetone.

Top Electrode Formation
29. Clean the processed samples in step 27 (acetone, IPA, DI water).
30. Pattern photoresist using third layer mask (steps 3-7).
31. Deposit 150 nm ITO through RF magnetron sputtering.
32. Lift-off ITO in acetone.
33. Conformal Parylene C coating (1 μm thickness)

This method resulted in a 3D array integration of vertical nanowire piezotronic transistors (including 92×92 taxels in 1 $cm^2$ with 234 taxels per inch (PPI)) as active taxel-addressable pressure-sensor matrix for tactile imaging. The fabricated sensors were capable of mapping spatial profiles of small pressure changes (<10 kPa).

Strain-gated piezotronic transistor operates based on modulation of local contact characteristics and charge carrier transport by strain-induced ionic polarization charges at the interface of metal-semiconductor contact, which is the fundamental of piezotronics. The basic structure of a strain-gated vertical piezotronic transistor (SGVPT) includes one or multiple vertically-grown ZnO nanowires in contact with bottom and top electrodes. A ZnO nanowire experiences strain when subjected to external mechanical deformation, with piezopotential induced inside the nanowire due to polarization of non-mobile ions. The local contact profile and carrier transport across the Schottky barrier, formed between ZnO nanowire and metal electrodes, can be effectively controlled by the polarization-charge-induced potential. Electrical characteristics of the two-terminal SGVPT are therefore modulated by external mechanical actions induced strain, which essentially functions as a gate signal for controlling carrier transport in SGVPT.

By combining the patterned in-place growth of vertically aligned ZnO nanowires with state-of-the-art micro-fabrication techniques, large-scale integration of SGVPT array can be obtained. The active array of SGVPTs was sandwiched between the top and bottom Indium Tin Oxide (ITO) electrodes, which were aligned in orthogonal cross-bar configurations. A thin layer of Au was deposited between the top/bottom surfaces of ZnO nanowires and top/bottom ITO electrodes, respectively, forming Schottky contacts with ZnO nanowires. A thin layer of Parylene C (1 μm) was conformally coated on the SGVPT device as the moisture/corrosive barrier. Well-aligned ZnO nanowires, synthesized by low-temperature hydrothermal method, functioned as the active channel material of SGVPT and helped reduce the stochastic taxel-to-taxel variation to ensure uniform device performance.

The piezotronic effect differs from the piezoresistive effect in that the latter results from change in band gap, charge carrier density or density of states in the conduction band of the strained semiconductor material that functions as a scalar "resistor," while the piezotronic effect arises due to the polarization of ions in the crystal and can directly affect the local contacts asymmetrically. This means that the piezoresistive effect is a symmetric volume effect without polarity, while piezotronic effect is an interface effect that asymmetrically modulates local contacts at different terminals of the device due to the polarity of the piezopotential. The magnitude and polarity of piezopotential within corresponding SGVPT changes according to the local stress/force, resulting in a direct control over local Schottky barrier heights (SBHs) and hence the corresponding conducting characteristics of the SGVPT by induced strain. The dominant mechanism for the transport property of SGVPT is the piezotronic effect rather than the piezoresistance effect. By monitoring the output current of each independently-functioning SGVPT in the matrix, spatial profile of applied pressure can be readily imaged by multiplexed-addressing all of the taxels.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of making a tactile sensing matrix, comprising the steps of:
   (a) generating a substrate;
   (b) depositing a first plurality of elongated electrodes, spaced apart, on the substrate along a first orientation;
   (c) depositing a first plurality of conductive shapes onto each of the first plurality of elongated electrodes, spaced apart so that the conductive shapes form a matrix including columns aligned with the first orientation and rows that are transverse to the first orientation;
   (d) generating a vertically aligned piezoelectric member at each of the first plurality of conductive shapes to form a plurality of piezoelectric members, the piezoelectric members including a material that forms a Schottky contact with the first plurality of conductive shapes;
   (e) depositing a second plurality of conductive shapes each on a different piezoelectric member, the second plurality of conductive shapes including a material that forms a Schottky contact with the piezoelectric member;
   (f) infusing an insulating layer into the piezoelectric members; and
   (g) depositing a second plurality of elongated electrodes, each along a different row of the matrix so that each of the second plurality of elongated electrodes is in electrical communication with all of the second plurality of conductive shapes of a different row of piezoelectric members,
      wherein when pressure is applied to selected ones of the plurality of vertically-aligned piezoelectric members, current flow through the selected ones of the plurality of vertically-aligned piezoelectric members is modulated.

2. The method of claim 1, further comprising the step of applying a protective coating around the tactile sensing matrix.

3. The method of claim 1, wherein the first plurality of conductive shapes and the second plurality of conductive shapes comprises Au.

4. The method of claim 1, wherein the substrate comprises an $SiO_2$ layer.

5. The method of claim 1, wherein the step of depositing the first plurality elongated electrodes comprises:
   (a) depositing elongated Cr strips onto the substrate; and
   (b) depositing an ITO strip onto each of the Cr strips.

6. The method of claim 1, wherein the step of depositing the second plurality elongated electrodes comprises depositing an ITO strip onto the insulating layer so that the ITO strip is in electrical communication with each piezoelectric member along a row.

7. The method of claim 1, wherein each piezoelectric member comprises a material selected from a group consisting of: ZnO, ZnS, GaN, GaAs, piezoelectric semiconductors, and combinations thereof.

8. The method of claim 1, wherein each piezoelectric member comprises a structure selected from a group consisting of: a nanowire, a dense bundle of nanowires, a polygon of a thin film, and combinations thereof.

9. A tactile sensing matrix, comprising:
   (a) a substrate;
   (b) a first plurality of elongated electrode structures spaced apart and disposed on the substrate along a first orientation;
   (c) a plurality of vertically aligned piezoelectric members disposed on each of the first plurality of elongated electrode structures, the piezoelectric members spaced apart so as to form a matrix both along the first plurality elongated electrode structures and across the first plurality elongated electrode structures, the matrix having columns of piezoelectric members disposed along the first orientation and rows of piezoelectric members disposed along a second orientation that is transverse to the first orientation, wherein each of the first plurality elongated electrode structures comprises:
      (i) an elongated Cr strip deposited on the substrate;
      (ii) an ITO layer disposed on each Cr strip; and (iii) a plurality of spaced-apart conductive shapes deposited on to the ITO layer, each conductive shape disposed under a different piezoelectric member;

(d) an insulating layer infused into the piezoelectric members; and (e) a second plurality of elongated electrode structures spaced apart and disposed on the insulating layer along the second orientation, the first plurality of elongated electrode structures including a material selected so that each of the first plurality of elongated electrode structures forms a Schottky contact with each piezoelectric member in a different column of piezoelectric members and the second plurality of elongated electrode structures including a material selected so that each of the second plurality of elongated electrode structures forms a Schottky contact with each piezoelectric member in a different row of piezoelectric members, so that when pressure is applied to selected ones of the plurality of vertically-aligned piezoelectric members, current flow through the selected ones of the plurality of vertically-aligned piezoelectric members is modulated.

10. The tactile sensing matrix of claim 9, wherein the conductive shapes comprise Au.

11. The tactile sensing matrix of claim 9, wherein each of the second plurality elongated electrode structures comprises:

(a) a plurality of conductive shapes, each deposited on a different piezoelectric member; and (b) an ITO strip disposed on the conductive shapes.

12. The tactile sensing matrix of claim 11, wherein the conductive shapes comprise Au.

13. The tactile sensing matrix of claim 9, wherein the substrate comprises $SiO_2$.

14. The tactile sensing matrix of claim 9, wherein each piezoelectric member comprises a material selected from a group consisting of: ZnO, ZnS, GaN, and GaAs, piezoelectric semiconductors, and combinations thereof.

15. The tactile sensing matrix of claim 9, wherein each piezoelectric member comprises a structure selected from a group consisting of: a nanowire, a dense bundle of nanowires, a polygon of a thin film, and combinations thereof.

16. The tactile sensing matrix of claim 9, wherein the insulating layer comprises SU 8.

17. The tactile sensing matrix of claim 9, further comprising a protective coating deposited about the tactile sensing matrix.

18. The tactile sensing matrix of claim 17, wherein the protective coating comprises parylene.

* * * * *